United States Patent

Uno et al.

[11] Patent Number: 6,080,492
[45] Date of Patent: Jun. 27, 2000

[54] GOLD ALLOY THIN WIRE FOR SEMICONDUCTOR DEVICES

[75] Inventors: Tomohiro Uno; Kohei Tatsumi, both of Kawasaki, Japan

[73] Assignee: Nippon Steel Corporation, Tokyo, Japan

[21] Appl. No.: 08/895,187

[22] Filed: Jul. 16, 1997

[51] Int. Cl.[7] .............................. B21C 37/00; C22C 5/02
[52] U.S. Cl. .................. 428/606; 420/507; 420/508; 420/509; 420/510
[58] Field of Search .................. 428/606; 420/507, 420/508, 509, 510

[56] References Cited

U.S. PATENT DOCUMENTS

| | | | |
|---|---|---|---|
| 4,330,329 | 5/1982 | Hayashi et al. | 420/511 |
| 4,885,135 | 12/1989 | Hosoda et al. | 420/507 |
| 5,071,619 | 12/1991 | Hosoda et al. | 420/507 |
| 5,298,219 | 3/1994 | Toyofuka et al. | 420/507 |
| 5,491,034 | 2/1996 | Ohno et al. | 428/606 |
| 5,658,664 | 8/1997 | Uno et al. | 428/364 |

FOREIGN PATENT DOCUMENTS

| | | |
|---|---|---|
| 2-119148 | 5/1990 | Japan . |
| 2-215140 | 8/1990 | Japan . |
| 3-130337 | 6/1991 | Japan . |
| 8-193233 | 7/1996 | Japan . |
| 8-291348 | 11/1996 | Japan . |

*Primary Examiner*—Paul Thibodeau
*Assistant Examiner*—Holly C. Rickman
*Attorney, Agent, or Firm*—Kenyon & Kenyon

[57] ABSTRACT

To provide a gold alloy thin wire advantageously applicable to high density packaging of semiconductor devices, in which the wire deformation upon resin molding is reduced to successfully achieve reduction in the bonding pitch and the wire diameter, a gold alloy thin wire according to the present invention consists of 0.015 to 1.0 wt % Cu, 0.0002 to 0.02 wt % Ca, and the balance consisting of Au and unavoidable impurities. Preferably, the Cu content is 0.1 to 1.0 wt % and the Ca content is 0.001 to 0.02 wt %, and more preferably, Cu and Ca are present in a weight content ratio Cu/Ca of from 40 to 800. The gold alloy thin wire further preferably contains one or more of Pt, Pd and In in a total amount of from 0.01 to 3.0 wt % and/or one or more of Y, La, and Ce in a total amount of from 0.0003 to 0.03 wt %.

9 Claims, No Drawings

GOLD ALLOY THIN WIRE FOR SEMICONDUCTOR DEVICES

BACKGROUND OF THE INVENTION

1. Field of the Invention

The present invention relates to a gold alloy thin wire for bonding or electrically connecting electrodes, on a semiconductor device, to external leads.

2. Description of the Related Art

Currently, circuitry wiring electrodes on a semiconductor device are electrically connected to external leads mainly by wire bonding.

The recent trend for advanced integration and function multiplication of semiconductor devices requires further miniaturization and thickness reduction of IC chips, including a need for high density packaging of semiconductor devices. To realize increase in the number of pins or terminals, the inner leads must be moved away from a silicon chip and the wire bonding span is increased. For long wire bonding spans of greater than 5 mm, it is necessary to strictly control the loop shape, including the straightness, and the reduction in dispersion. The increased number of pins also requires a reduced or refined bonding pitch or electrode interval, such as a minimum bonding pitch of 100 $\mu$m or less, and thinner wires are also desired.

To achieve the increase in the number of pins and the reduction of wire pitch, efforts have been made to improve the bonding apparatus and to develop a wire having an improved looping property.

In high density packaging of semiconductor devices, for a long span of 5 mm or more, the most important problem is to prevent undesirable connection between neighboring wires and between a wire and a chip or an inner lead in order to successfully ensure the increase in the number of pins and the fine pitch. When the bonding span is increased, although various looping controls are conducted to ensure the loop height and prevent the wire dangling, loop bending unavoidably occurs more frequently upon bonding. During molding using viscous epoxy resins, the wire deforms by being swept and the sweep degree is increased with the increase in the bonding span to allow frequent occurrence of undesirable connection between neighboring wires.

The reduction in the bonding pitch also involves thinning of the wire or reduction in the wire diameter, which renders more serious the problems of the wire bend upon loop formation and the wire sweep during resin molding as can be expected from the fact that the wire strength is reduced in proportion to the square of the wire diameter. The reduced bonding pitch also requires a reduced ball size rendering it difficult to ensure the bondability of the balls.

From the view point of thinning wire and ensuring bondability, the effect of the additive alloying elements to gold alloy thin wires has been studied. For example Japanese Unexamined Patent Publication (Kokai) No. 2-119148 disclosed that Cu is an effective additive element. However, Cu must be present in an amount of 1 to 5 wt % to provide substantial effect and it is feared that such a large amount would cause a defective shape and undesirable hardening of ball. Japanese Unexamined Patent Publication (Kokai) No. 2-215140 also disclosed addition of selective amounts of Mn, Cu, and Ni in a gold wire. This only relates to suppression of formation of chemical compounds at an Au/Al joint.

SUMMARY OF THE INVENTION

The object of the present invention is to provide a gold alloy thin wire advantageously applicable for high density packaging of semiconductor devices, in which the wire deformation upon resin molding is reduced to successfully achieve reduction in the bonding pitch and thinning of the wire.

To this end, the present inventors have conducted numerous studies on the wire properties necessary for high density packaging of semiconductor devices and have found that the most important technological point is to reduce the wire deformation during the loop formation and resin molding.

The present inventors have further studied the relationship between the alloying elements of a gold alloy thin wire and the loop straightness and wire sweep and have first found that the combined addition of Cu and Ca effectively suppresses the wire sweep and that Cu and Ca are most effective when present in a limited Cu/Ca content ratio.

The present inventors have also found that the addition of Pt, Pd and In improves the wire strength in the heat affected zone near a ball and that the addition of Y, La and Ce improves the wire sweep resistance upon resin molding.

To achieve the object according to the first aspect of the present invention, there is provided a cold alloy thin wire consisting of 0.015 to 1.0 wt % Cu, 0.0002 to 0.02 wt % Ca, and the balance consisting of Au and unavoidable impurities.

According to the second aspect of the present invention, there is also provided a gold alloy thin wire consisting of 0.1 to 1.0 wt % Cu, 0.001 to 0.02 wt % Ca, and the balance consisting of Au and unavoidable impurities.

According to the third aspect, a gold alloy thin wire of the first or second aspect has a weight content ratio Cu/Ca of from 40 to 800.

According to the fourth aspect, a gold alloy thin wire of the first, second or third aspect further contains one or more of Pt, Pd and In in a total amount of from 0.01 to 3.0 wt %.

According to the fifth aspect, a gold alloy thin wire of the first, second or third aspect further contains one or more of Y, La, and Ce in a total amount of from 0.0003 to 0.03 wt %.

According to the sixth aspect, a gold alloy thin wire of the first, second or third aspect further contains one or more of Pt, Pd and In in a total amount of from 0.01 to 3.0 wt % and one or more of Y, La, and Ce in a total amount of from 0.0003 to 0.03 wt %.

DESCRIPTION OF THE PREFERRED EMBODIMENTS

The gold alloy thin wire of the present invention will be described in further detail.

To estimate the loop straightness and the wire sweep resistance upon resin molding, it is necessary that bonding is carried out using a metal thin wire, the deformation of the thus-formed wire loop is then measured, and after resin molding the wire-bonded sample, the wire sweep is measured. Because the loop deformation and the wire sweep significantly depend on the operating parameters of the bonding apparatus and/or the resin molding apparatus and the kind of molding resin, it is difficult to extract the material factors of the metal thin wire alone.

The present inventors studied correlation of the loop straightness and the wire sweep upon resin molding with respect to the mechanical properties of a metal thin wire including the tensile strength, the elastic constant, the yield strength, etc., and found that, as the fracture strength determined by tensile test is increased, the loop straightness is improved and the wire sweep upon resin molding is also suppressed. Although more strict analysis requires inclusion of other properties such as the elastic constant, the yield strength and the bend elasticity, the tensile strength can be easily measured to estimate the property of a metal thin wire for the reduced bonding pitch and wire diameter.

The tensile strength of a gold alloy thin wire is substantially increased by the combined addition of Cu and Ca. The single addition of Cu alone increases the room temperature strength but the effect is too small to satisfy the requirement for high density packaging.

On the other hand, the single addition of Ca alone increases the strength but a defective ball shape occurs due to oxidation of Ca when added in a large amount. The upper limit of the Ca amount is thus determined from the ball shape and the single addition of Ca alone does not provide a sufficient strength for a reduced wire diameter.

Table 1 shows the effect of Cu and Ca addition on the tensile strength. A wire having a diameter of 24 μm was continuously annealed by being passed through a horizontal furnace and subjected to a tensile test to determine the fracture strength and the elastic constant of the wire. Because metal thin wires for semiconductor devices generally have a fracture elongation of 3 to 5%, the annealing temperature was selected to provide an elongation of 4%.

As can be seen from Table 1, the combined addition of Cu and Ca provides an increase in the fracture strength by 30 to 50% with respect to those obtained by the single addition of Cu or Ca alone in an optimum amount. The inventors have learned from experience that, when a metal thin wire has a tensile strength of 13.5 gf or more or an elastic constant of 8500 kgf/mm$^2$ or more, the wire deformation can be reduced to be practically acceptable for a long bonding span of about 5 mm. Sample 1 according to the present invention, in which both Cu and Ca are added, satisfies the above-recited conditions.

The Cu and Ca contents must be within the specified range for the following reasons. When the Cu content is less than 0.015 wt % or the Ca content is lass than 0.0002 wt %, no significant improvement of the mechanical properties is obtained. On the other hand, when the Ca content is more than 0.02 wt %, a shrinkage cavity forms in the ball top or the ball sphericity is degraded, or when the Cu content is more than 1.0 wt %, the work hardening during wire drawing is intensified to cause an accelerated die wear and the frequent occurrence of wire bending, and this tendency becomes more remarkable as the wire diameter is reduced. One solution is to perform intermediate annealing several times, but the production process is complicated.

More preferably, the Cu content is 0.1 to 1.0 wt % and the Ca content is 0.001 to 0.02 wt %, because the tensile strength and the elastic constant are further increased when the Cu content is 0.1 wt % or more and the Ca content is 0.001 wt % or more.

The combined addition of Cu and Ca improves the tensile strength and the elastic constant, particularly when the Cu/Ca weight content ratio is in the specified range. In Table 1, the single addition of Ca alone provides a similar effect on the strength as shown by Samples (b) and (c), and on the other hand, in Sample 1 and 2 according to the present invention in which the same amount of Cu is added to Samples (b) and (c), the tensile strength and the elastic constant are increased and the increase is more significant in Sample 1. A weight content ratio Cu/Ca of from 40 to 800 provides the most remarkable combination effect. In Sample 2 having a content ratio of 1400, the increase in the tensile strength is relatively small. In Sample 1 having a content ratio of 300, a tensile strength of as high as 15 gf or more and an elastic constant of as high as 9000 kgf/mm$^2$ or more are obtained.

Although the improvement mechanism of these elements is not completely clarified, the inventors believe that Cu and Ca have interaction therebetween to cause a precipitation thereof or a formation of compound phases in the Au matrix to provide the improved mechanical properties, particularly when Cu and Ca are present in the specified range of the weight content ratio Cu/Ca.

The weight content ratio Cu/Ca is preferably in the range of from 40 to 800 to provide improved tensile strength and elastic constant by the combined addition of Cu and Ca. Although the combined addition of Cu and Ca is effective outside the above-recited preferred range, a weight content ratio of more than 800 only provides a smaller increase in the tensile strength and a weight content ratio of less than 40 increases the tensile strength but causes the problem that balls formed by melting the wire have an increased hardness to damage the underlying silicon chip during wire bonding.

The wire strength is proportional to the square of the wire diameter, and therefore, the strength of the wire material must be increased as the wire diameter is reduced in order to ensure the wire sweep resistance. The gold alloy thin wires having a diameter of from 25 to 30 μm are currently generally used but are not suitable for a refined pitch. The gold alloy thin wire having an improved strength by the combined addition of Cu and Ca according to the present invention is advantageously used for a reduced wire diameter of 25 μm or less. The improved strength by the combined addition of Cu and Ca is particularly advantageous for wire diameters of 23 μm or less, in which the wire should have a strength increased by 20% or more with respect to that of a 25 μm wire.

To reduce the bonding pitch, lead frames must have a reduced inner lead, which causes trouble due to vibration during conveyance. To provide vibration resistance, the neck portion immediately above the ball portion preferably has a high strength, and to this end, coarsening of recrystallized grains due to heat effect must be suppressed at that portion.

In addition to the combined addition of Cu and Ca, one or more of Pt, Pd and In are preferably contained to refine grains of the neck portion to increase the neck strength. Simple addition of Pt, Pd and In alone cannot substantially suppress recrystallization in the neck portion but the coaddition with Cu and Ca provides a synergistic effect of improving the neck strength. The total amount of Pt, Pd and In must be 0.01 wt % or more to ensure the above-mentioned effect. The total amount of Pt, Pd and In, however, must not be more than 3.0 wt % to avoid flattening, and ensure good sphericity, of the ball to thereby facilitate the formation of small balls necessary for the reduced pitch bonding. An excessive addition of Pt, Pd and In also causes hardening of the ball portion and can damage a silicon chip during bonding.

In the resin molding process, a highly viscous, thermosetting resin is poured at a high speed into a mold heated at 150 to 200° C. and causes the bonding wires to be deformed. The deformation of the bonding wire due to resin flow mainly depends upon the mechanical properties of the wire, particularly the properties at elevated temperatures.

The addition of one or more of Y, La and Ce in a total amount of from 0.0003 to 0.03 wt % provides an improved high temperature wire strength. Simple addition of Y, La and Ce alone only slightly improves the room temperature wire strength and the coaddition with Cu and Ca is necessary to provide significant improvement in the room temperature wire strength. The total amount of Y, La and Ce must be 0.0003 wt % or more to provide significant improvement in the high temperature wire strength but must not be more than 0.03 wt % to avoid formation of a shrinkage cavity in the ball or degradation of the sphericity of ball.

EXAMPLES

By using an electrolytic gold having a purity of 99.995 wt % or higher, gold alloys having the chemical compositions as shown in Table 2 were melted in a melting furnace, cast to ingots, rolled and wire-drawn to form gold alloy thin wires having a final diameter of 24 μm, which were then continuously annealed in air to produce wires having a controlled elongation.

A gold alloy ball was formed by arc discharge at a tip of wire in a high speed automatic bonder for wire bonding, and was subjected to observation in a scanning electron microscope. The balls of Examples 1 to 29 of the present invention were observed to be spherical. Detailed observation of the ball surface showed that some balls had a shrinkage cavity at the ball tip. In Table 2, the symbol "○" means "with shrinkage cavity" and the symbol "◎" means "without shrinkage cavity".

To study the chip damage which might have occurred during a bonding operation, the bonded devices are immersed in aqua regia to dissolve the gold alloy wires and the aluminum electrodes and the bonded points of the chip were then observed in an optical microscope. Examples 1 to 29 of the present invention had no practically unacceptable damages. In Table 2, the symbol "○" means that microcracks were observed and the symbol "◎" means that no damage was observed.

To determine the neck strength after formation of a loop, a lead frame and the semiconductor chip were fixed in a holder and the bonded gold alloy wire was pulled in the middle portion. The neck strength was estimated by a mean value of the pull strength, i.e., the tensile strength upon fracture, for 100 samples.

To determine the wire bend, a wire was bonded at a bonding span of 4.5 mm in terms of the distance between the bonded ends of the wire and was observed from above in a substantially vertical direction in a projector to measure the length of a normal line drawn from the outermost point of a bowed wire to a straight Line extending through the bonded ends. The wire bend was estimated by a mean value of 80 samples.

To determine the wire sweep upon resin molding, a lead frame with a semiconductor device mounted thereon and having wires bonded at a span of 4.5 mm was molded with epoxy resin in a molding apparatus and the inside of the resin-molded device was observed as an X-ray projection by using a soft X-ray inspector, in which the sweep distance was measured at the outermost point of a bowed wire in the same manner as for the wire bend and the wire sweep was determined in terms of a percentage of the sweep distance with respect to the span length of 4.5 mm. The wire sweep was estimated by mean value of 80 samples.

Table 2 summarizes the results for examples having chemical compositions within the specified ranges of the present invention and Table 3 summarizes the results for comparative examples having chemical compositions outside the specified ranges.

In Table 2, Examples 1 to 29 relate to the first aspect of the present invention, Examples 2 to 17 and 22 to 29 relate to the second aspect, Examples 1 to 17 and 22 to 29 relate to the third aspect, Examples 7 and 11 relate to the fourth aspect, Examples 12 to 15 relate to the fifth aspect, and Examples 16 to 17 relate to the sixth aspect.

In Table 3, Comparative Examples C1 to C4 had a wire sweep upon resin molding as high as 6% or more, which means high probability of occurrence of a defect due to undesirable connection between neighboring wires, and also had a wire bend of 20 μm or more, which means undesirable dispersion of the loop shape.

In contrast, Examples 1 to 29 according to the first aspect of the present invention had a reduced wire sweep value of 5% or less. Examples 2 to 17 and 22 to 29 containing 0.1 to 1.0 wt % Cu and 0.001 to 0.02 wt % Ca with a weight content ratio Cu/Ca controlled within the range of 40 to 800 had a further reduced wire sweep value of 4% or less as well as good bonding performance, in comparison with those of Examples 20 and 21 containing Cu and Ca in a weight content ratio Cu/Ca of greater than 800.

In Comparative Example C5 containing more than 1.0 wt % Cu, the wire drawing process required intermediate annealing to be conducted three times to avoid die wear and wire bending during wire drawing due to high drawing resistance.

In comparison with the above-recited Examples 2 to 17 and 22 to 29 having preferred Cu/Ca values, Examples 20 and 21 containing Cu and Ca in amounts within the specified ranges but with a weight content ratio Cu/Ca of greater than 800 had slightly greater wire sweep values of about 4.5% although the properties are generally improved, and on the other hand, Examples 18 and 19 containing Cu and Ca in amounts within the specified ranges but with a weight content ratio Cu/Ca of smaller than 40 had a few microcracks on the bonded chip surface.

Examples 7 to 11 containing Pt, Pd and In according to the fourth aspect had an improved pull strength of 7 gf or more, in which the wires necessarily broke at the portion immediately above the neck proving an increased neck strength.

In contrast, Examples 22 and 23 containing Pt, Pd and In in a total amount of less than 0.01 wt % did not significantly show the above effect, and on the other hand, Examples 24 and 25 containing Pt, Pd and In in a total amount of more than 3.0 wt % showed a slight damage on the bonded chip although the above effect was also obtained.

Examples 12 to 15 according to the fifth aspect showed a wire sweep suppressed to 3% or less.

In contrast, Examples 26 and 27 containing Y, La and Ce in a total amount of less than 0.0003 wt % showed the above effect to a lower degree, and on the other hand, Examples 28 and 29 containing Y, La and Ce in a total amount of more than 0.03 wt % showed an about 2–3 μm small shrinkage cavity at the ball tip.

As herein described above, the present invention provides a gold alloy thin wire having reduced wire bend upon bonding and reduced wire sweep upon resin molding and is advantageously applicable to high density packaging of semiconductor chips involving reduced bonding pitch.

TABLE 1

| Sample | Additives | Tensile Strength (gf) | Elastic Constant (kgf/mm$^2$) |
|---|---|---|---|
| (a) | Cu alone (0.6 wt %) | 9.5 ± 0.3 | 8000 ± 200 |
| (b) | Ca alone (0.002 wt %) | 11.8 ± 0.4 | 7800 ± 200 |

TABLE 1-continued

| Sample | Additives | Tensile Strength (gf) | Elastic Constant (kgf/mm²) |
|---|---|---|---|
| (c) | Ca alone (0.00043 wt %) | 11.4 ± 0.4 | 7600 ± 150 |
| 1 | Cu + Ca, (a) + (b), Cu/Ca = 300 | 15.8 ± 0.4 | 9400 ± 100 |
| 2 | Cu + Ca, (a) + (c), Cu/Ca = 1400 | 13.9 ± 0.3 | 8600 ± 200 |
| Au | (purity > 99.999%) | 6.2 ± 0.3 | 6000 ± 200 |

TABLE 2

Examples of the Invention

| No. | Cu | Ca | Pt | Pd | In | Y | La | Ce | Au | Cu/Ca | Ball Shape | Bonding Damage | Wire Bend (μm) | Pull Strength (gf) | Wire Sweep (%) |
|---|---|---|---|---|---|---|---|---|---|---|---|---|---|---|---|
| 1 | 0.02 | 0.0003 | | | | | | | Bal. | 66.7 | ◎ | ◎ | 19.8 | 5.2 | 4.5 |
| 2 | 0.15 | 0.001 | | | | | | | Bal. | 150.0 | ◎ | ◎ | 17.0 | 5.8 | 3.9 |
| 3 | 0.3 | 0.003 | | | | | | | Bal. | 100.0 | ◎ | ◎ | 15.6 | 6.0 | 3.8 |
| 4 | 0.5 | 0.006 | | | | | | | Bal. | 83.3 | ◎ | ◎ | 12.6 | 6.0 | 3.3 |
| 5 | 0.8 | 0.018 | | | | | | | Bal. | 44.4 | ◎ | ◎ | 10.5 | 6.8 | 3.0 |
| 6 | 0.9 | 0.015 | | | | | | | Bal. | 60.0 | ◎ | ◎ | 8.5 | 6.5 | 3.1 |
| 7 | 0.5 | 0.003 | 0.015 | | | | | | Bal. | 166.7 | ◎ | ◎ | 15.7 | 7.5 | 3.8 |
| 8 | 0.5 | 0.003 | | 0.02 | | | | | Bal. | 166.7 | ◎ | ◎ | 15.6 | 7.7 | 3.6 |
| 9 | 0.5 | 0.003 | 0.003 | | 0.05 | | | | Bal. | 166.7 | ◎ | ◎ | 15.7 | 7.5 | 3.7 |
| 10 | 0.5 | 0.003 | 1 | 1.5 | | | | | Bal. | 166.7 | ◎ | ◎ | 16.5 | 8.2 | 3.8 |
| 11 | 0.48 | 0.003 | 0.8 | 0.8 | 0.05 | | | | Bal. | 160.0 | ◎ | ◎ | 16.0 | 7.9 | 3.8 |
| 12 | 0.7 | 0.0025 | | | | 0.0005 | | | Bal. | 280.0 | ◎ | ◎ | 15.0 | 6.0 | 2.9 |
| 13 | 0.7 | 0.0025 | | | | | 0.0010 | | Bal. | 280.0 | ◎ | ◎ | 14.8 | 6.1 | 2.8 |
| 14 | 0.7 | 0.0025 | | | | 0.0030 | | 0.0050 | Bal. | 280.0 | ◎ | ◎ | 14.6 | 6.1 | 2.5 |
| 15 | 0.7 | 0.0025 | | | | | 0.0050 | 0.0100 | Bal. | 280.0 | ◎ | ◎ | 14.5 | 6.3 | 2.6 |
| 16 | 0.7 | 0.003 | 0.8 | 0.5 | | 0.0040 | | 0.0020 | Bal. | 233.3 | ◎ | ◎ | 15.1 | 8.0 | 2.3 |
| 17 | 0.7 | 0.003 | 1 | 0.8 | | 0.0050 | 0.0050 | | Bal. | 233.3 | ◎ | ◎ | 14.8 | 8.1 | 2.4 |
| 18 | 0.05 | 0.0020 | | | | | | | Bal. | 25.0 | ◎ | ○ | 10.7 | 7.0 | 2.4 |
| 19 | 0.08 | 0.0040 | | | | | | | Bal. | 20.0 | ◎ | ○ | 10.7 | 7.0 | 2.4 |
| 20 | 0.6 | 0.0005 | | | | | | | Bal. | 1200 | ◎ | ◎ | 20.1 | 5.7 | 4.2 |
| 21 | 0.8 | 0.0008 | | | | | | | Bal. | 1000 | ◎ | ◎ | 19.8 | 5.8 | 4.1 |
| 22 | 0.5 | 0.0030 | 0.001 | | | | | | Bal. | 166.7 | ◎ | ◎ | 16.4 | 6.7 | 3.9 |
| 23 | 0.5 | 0.0030 | 0.001 | | 0.0008 | | | | Bal. | 166.7 | ◎ | ◎ | 16.2 | 6.8 | 3.8 |
| 24 | 0.5 | 0.0030 | 2.000 | 2.000 | | | | | Bal. | 166.7 | ○ | ◎ | 15.6 | 8.9 | 3.4 |
| 25 | 0.5 | 0.0030 | | 2.500 | 1.000 | | | | Bal. | 166.7 | ○ | ◎ | 15.9 | 8.6 | 3.5 |
| 26 | 0.7 | 0.0025 | | | | 0.0002 | | | Bal. | 280.0 | ◎ | ◎ | 15.9 | 6.1 | 3.4 |
| 27 | 0.7 | 0.0025 | | | | | 0.0002 | | Bal. | 280.0 | ◎ | ◎ | 15.7 | 6.0 | 3.2 |
| 28 | 0.7 | 0.0025 | | | | 0.0200 | | 0.0150 | Bal. | 280.0 | ○ | ◎ | 14.8 | 5.8 | 2.5 |
| 29 | 0.7 | 0.0025 | | | | | 0.0150 | 0.020 | Bal. | 280.0 | ○ | ◎ | 15.0 | 6.4 | 2.6 |

TABLE 3

Comparative Examples

| No. | Cu | Ca | Pt | Pd | In | Y | La | Ce | Au | Cu/Ca | Ball Shape | Bonding Damage | Wire Bend (μm) | Pull Strength (gf) | Wire Sweep (%) |
|---|---|---|---|---|---|---|---|---|---|---|---|---|---|---|---|
| C1 | 0.01 | | | | | | | | Bal. | — | ◎ | ◎ | 35.5 | 3.9 | 6.5 |
| C2 | | 0.03 | | | | | | | Bal. | 0.0 | ◎ | ◎ | 26.0 | 4.6 | 6.1 |
| C3 | 0.01 | 0.0005 | | | | | | | Bal. | 20.0 | ◎ | ◎ | 24.8 | 4.7 | 6.0 |
| C4 | 0.15 | 0.00008 | | | | | | | Bal. | 1875 | ◎ | ◎ | 25.8 | 4.6 | 6.0 |
| C5 | 1.2 | 0.0030 | | | | | | | Bal. | 400.0 | ○ | ◎ | 11.5 | 5.9 | 3.0 |
| C6 | 0.8 | 0.0300 | | | | | | | Bal. | 26.7 | ○ | ○ | 10.4 | 6.2 | 2.9 |

What is claimed is:

1. A gold alloy wire consisting of 0.015 to 0.9 wt % Cu, 0.0002 to 0.02 wt % Ca, and the balance consisting of Au and unavoidable impurities.

2. A gold alloy wire consisting of 0.1 to 0.9 wt % Cu, 0.001 to 0.02 wt % Ca, and the balance consisting of Au and unavoidable impurities.

3. A gold alloy wire consisting of 0.015 to 0.9 wt % Cu, 0.0002 to 0.02 wt % Ca, one or more of Pt, Pd, and In in a total amount of from 0.01 to 3.0 wt %, and the balance consisting of Au and unavoidable impurities.

4. A gold alloy wire consisting of 0.015 to 0.9 wt % Cu, 0.0002 to 0.02 wt % Ca, one or more of Y, La, and Ce in a total amount of from 0.0003 to 0.03 wt %, and the balance consisting of Au and unavoidable impurities.

5. A gold alloy wire consisting of 0.015 to 0.9 wt % Cu, 0.0002 to 0.02 wt % Ca, one or more of Pt, Pd and In in a total amount of from 0.01 to 3.0 wt %, one or more of Y, La, and Ce in a total amount of from 0.0003 to 0.03 wt %, and the balance consisting of Au and unavoidable impurities.

6. A gold alloy wire consisting of 0.1 to 0.9 wt % Cu, 0.001 to 0.02 wt % Ca, one or more of Pt, Pd, and In in a total amount of from 0.01 to 3.0 wt %, and the balance consisting of Au and unavoidable impurities.

7. A gold alloy wire consisting of 0.1 to 0.9 wt % Cu, 0.001 to 0.02 wt % Ca, one or more of Y, La, and Ce in a total amount of from 0.0003 to 0.03 wt %, and the balance consisting of Au and unavoidable impurities.

8. A gold alloy wire consisting of 0.1 to 0.9 wt % Cu, 0.001 to 0.02 wt % Ca, one or more of Pt, Pd and In in a total amount of from 0.01 to 3.0 wt %, one or more of Y, La, and Ce in a total amount of from 0.0003 to 0.03 wt %, and the balance consisting of Au and unavoidable impurities.

9. A gold alloy wire according to any one of claims 1–8, having a weight content ratio Cu/Ca of from 40 to 800.

* * * * *